United States Patent
Basilico et al.

(10) Patent No.: US 10,972,063 B2
(45) Date of Patent: Apr. 6, 2021

(54) AMPLIFIER SYSTEMS FOR MEASURING A WIDE RANGE OF CURRENT

(71) Applicant: Analog Devices Global Unlimited Company, Hamilton (BM)

(72) Inventors: Simon Nicholas Fiedler Basilico, San Francisco, CA (US); Yoshinori Kusuda, San Jose, CA (US); Camille Louis Huin, Taipei (TW); Gary Carreau, Plaistow, NH (US); Gustavo Castro, North Andover, MA (US); Sean Patrick Kowalik, Chelmsford, MA (US); Michael C. W. Coln, Lexington, MA (US); Scott Andrew Hunt, Arlington, MA (US)

(73) Assignee: Analog Devices Global Unlimited Company, Hamilton (BM)

( * ) Notice: Subject to any disclaimer, the term of this patent is extended or adjusted under 35 U.S.C. 154(b) by 185 days.

(21) Appl. No.: 16/174,830

(22) Filed: Oct. 30, 2018

(65) Prior Publication Data

US 2020/0127624 A1  Apr. 23, 2020

Related U.S. Application Data

(60) Provisional application No. 62/746,726, filed on Oct. 17, 2018.

(51) Int. Cl.
*H03F 3/45* (2006.01)
*G01R 15/08* (2006.01)
(Continued)

(52) U.S. Cl.
CPC ......... *H03F 3/45475* (2013.01); *G01R 15/08* (2013.01); *G01R 19/2506* (2013.01);
(Continued)

(58) Field of Classification Search
CPC ... H02M 2001/0009; G01D 5/14; G01D 5/16; H03F 3/45475; H03F 2200/129;
(Continued)

(56) References Cited

U.S. PATENT DOCUMENTS

| | | | |
|---|---|---|---|
| 3,541,462 A | 11/1970 | Sarkisian et al. | |
| 5,754,041 A | 5/1998 | Kaito | |

(Continued)

FOREIGN PATENT DOCUMENTS

| | | |
|---|---|---|
| CN | 203414511 U | 1/2014 |
| CN | 103383404 B | 11/2015 |

(Continued)

OTHER PUBLICATIONS

Extended European Search Report for International Application No. 19202017.0 dated Apr. 6, 2020, in 14 pages.
(Continued)

*Primary Examiner* — Huy Q Phan
*Assistant Examiner* — Dustin R Dickinson
(74) *Attorney, Agent, or Firm* — Knobbe Martens Olson & Bear LLP

(57) ABSTRACT

Amplifier systems for measuring a wide range of current are provided herein. In certain embodiments, an amplifier system includes a controllable sensing circuit, a first amplifier including an output configured to drive a device under test (DUT) through the controllable sensing circuit, and a second amplifier including an input coupled to the controllable sensing circuit and operable to generate a measurement signal indicating an amount of measured current of the DUT. The amplifier system further includes a control circuit operable to control a configuration or mode of the controllable sensing circuit suitable for a particular type of DUT.

20 Claims, 8 Drawing Sheets

(51) Int. Cl.
*G01R 19/25* (2006.01)
*G01D 5/14* (2006.01)

(52) U.S. Cl.
CPC .......... *G01D 5/14* (2013.01); *H03F 2200/129* (2013.01); *H03F 2200/261* (2013.01); *H03F 2200/462* (2013.01); *H03F 2203/45116* (2013.01); *H03F 2203/45514* (2013.01)

(58) Field of Classification Search
CPC ......... H03F 2200/261; H03F 2200/462; H03F 2203/45116; H03F 2203/45114; H03F 2203/45112; G01R 19/0092; G01R 19/0084; G01R 19/2506; G01R 19/22; G01R 19/2503; G01R 15/08; G01R 15/09
See application file for complete search history.

(56) References Cited

U.S. PATENT DOCUMENTS

| | | | |
|---|---|---|---|
| 6,028,438 | A | 2/2000 | Gillette |
| 6,292,052 | B1 | 9/2001 | Carlson |
| 6,429,641 | B1 | 8/2002 | Montrose |
| 6,617,838 | B1 | 9/2003 | Miranda et al. |
| 7,403,065 | B1 | 7/2008 | Gresham et al. |
| 7,538,539 | B1 | 5/2009 | Balke |
| 8,115,474 | B2 | 2/2012 | Vulovic et al. |
| 9,052,343 | B2 | 6/2015 | Marten |
| 9,071,209 | B1 | 6/2015 | Harrison |
| 9,733,275 | B2 | 8/2017 | Deliwala et al. |
| 9,835,654 | B2 | 12/2017 | Boden |
| 2003/0025514 | A1 | 2/2003 | Benes |
| 2005/0206367 | A1 | 9/2005 | Krieger et al. |
| 2006/0202707 | A1 | 9/2006 | Harjung |
| 2006/0273811 | A1 | 12/2006 | Haigh et al. |
| 2007/0210810 | A1 | 9/2007 | Balke et al. |
| 2009/0121908 | A1 | 5/2009 | Regier |
| 2011/0025299 | A1 | 2/2011 | Vulovic et al. |
| 2012/0074928 | A1* | 3/2012 | Cs .......... G01R 15/16 324/123 R |
| 2013/0057341 | A1 | 3/2013 | Sobukawa |
| 2014/0171005 | A1* | 6/2014 | Mikhemar ............ H03F 1/223 455/293 |
| 2014/0266270 | A1 | 9/2014 | Faehnrich |
| 2015/0038092 | A1* | 2/2015 | Andrys .................. H04B 1/40 455/73 |
| 2017/0146575 | A1* | 5/2017 | Limon-Garcia-Viesca ................ G01R 15/146 |
| 2018/0019715 | A1* | 1/2018 | Young ..................... H03H 7/40 |
| 2018/0080960 | A1 | 3/2018 | Almosnino |
| 2018/0131342 | A1 | 5/2018 | Zamprogno et al. |
| 2018/0145543 | A1* | 5/2018 | Piasecki ............... G01R 15/146 |
| 2018/0172612 | A1* | 6/2018 | Lipowitz .............. G01N 27/026 |

FOREIGN PATENT DOCUMENTS

| | | |
|---|---|---|
| DE | 4221847 | 1/1994 |
| EP | 0136205 | 4/1985 |
| JP | 2016/205828 | 12/2016 |
| KR | 2010/0131490 | 12/2010 |
| KR | 2018/0025512 | 3/2018 |
| WO | WO 2012/039735 | 3/2012 |

OTHER PUBLICATIONS

Analog Devices, Inc., MT-068 Tutorial Rev. 0, 10/08, WK, 2009, 6 pgs.

Castro, "Rarely Asked Questions-Issue 133 Common Sense for Current Sensing," Analog Dialogue 50-09, Sep. 2016, 2pgs.

Ferrari et al. "Transimpedance Amplifier for High Sensitivity Current Measurements on Nanodevices" IEEE Journal of Solid-State Circuits, vol. 44, Issue 5, May 2009, 8 pages.

Noble, "Self-Scanned Silicon Image Detector Arrays," IEEE Transactions on Electron Devices, vol. Ed-15, No. 4, pp. 202-209, Apr. 1968.

Analog Devices: "Analog Devices ADATE302-02 Data Sheet 500 MHz Dual Integrated DCL with Differential Drive/Receive, Level Setting DACs, and Per Pin PMU", Dec. 31, 2009, pp. 1-58, XP055716071, Retrieved from the Internet: URL:https://www.analog.com/media/en/technical-documentation/data-sheets/ADATE302-02.pdf Maxim: "Maxim Data Sheet MAX9979 Dual 1.1 Gbps Pin Electronics with Integrated PMU and Level-Setting DACs", Dec. 31, 2011, pp. 1-61, XP055716067, Retrieved from the Internet: URL:http://www.datasheetcatalog.com.

Maxim: "Maxim Application Note APP4343 PMU Mode Operation for the MAX9979 Pin- Electronics IC", Dec. 24, 2008, pp. 1-7, XP055716060, Retrieved from the Internet: URL:https://pdfserv.maximintegrated.com/en/an/AN4343.pdf.

Extended European Search Report for International Application No. 19202017.0 dated Jul. 30, 2020, in 18 pages.

* cited by examiner

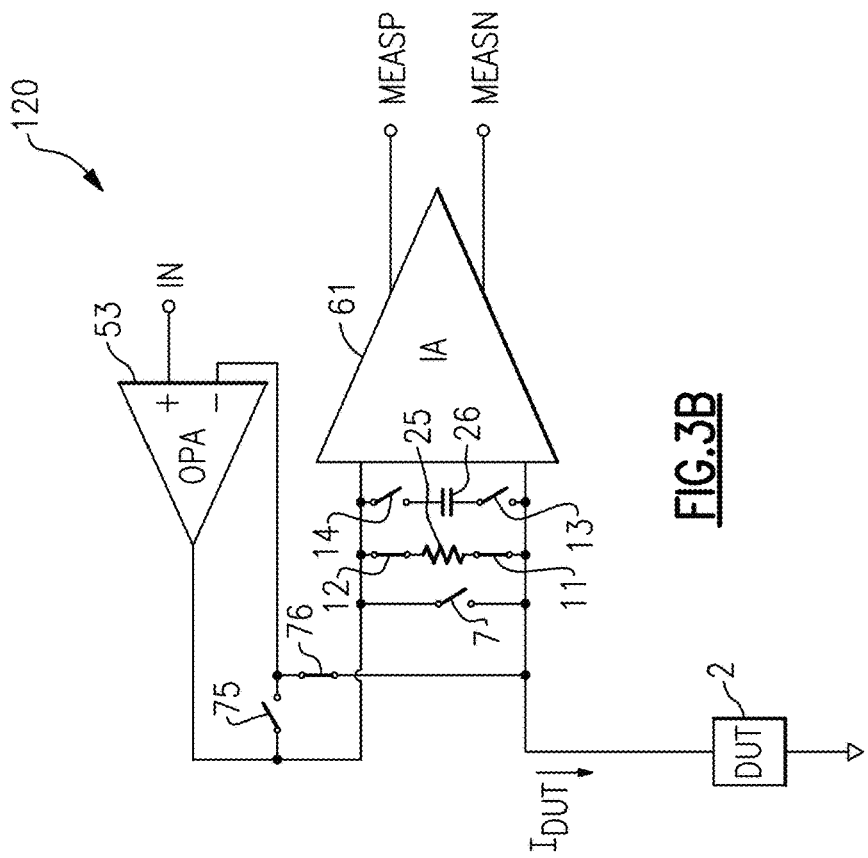
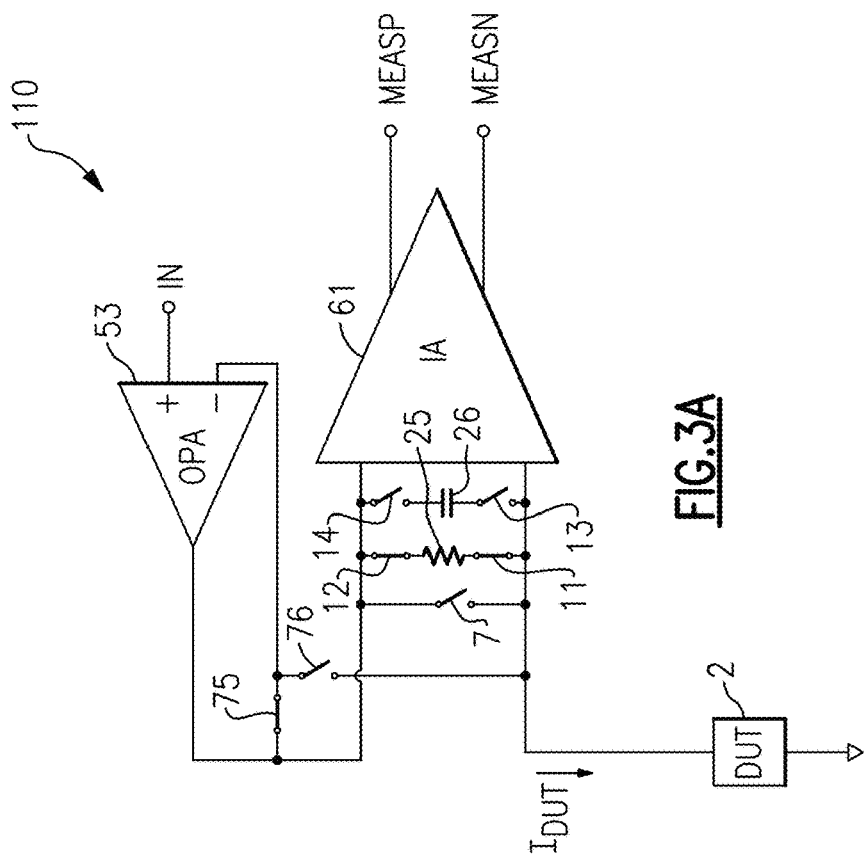
FIG.3A
FIG.3B

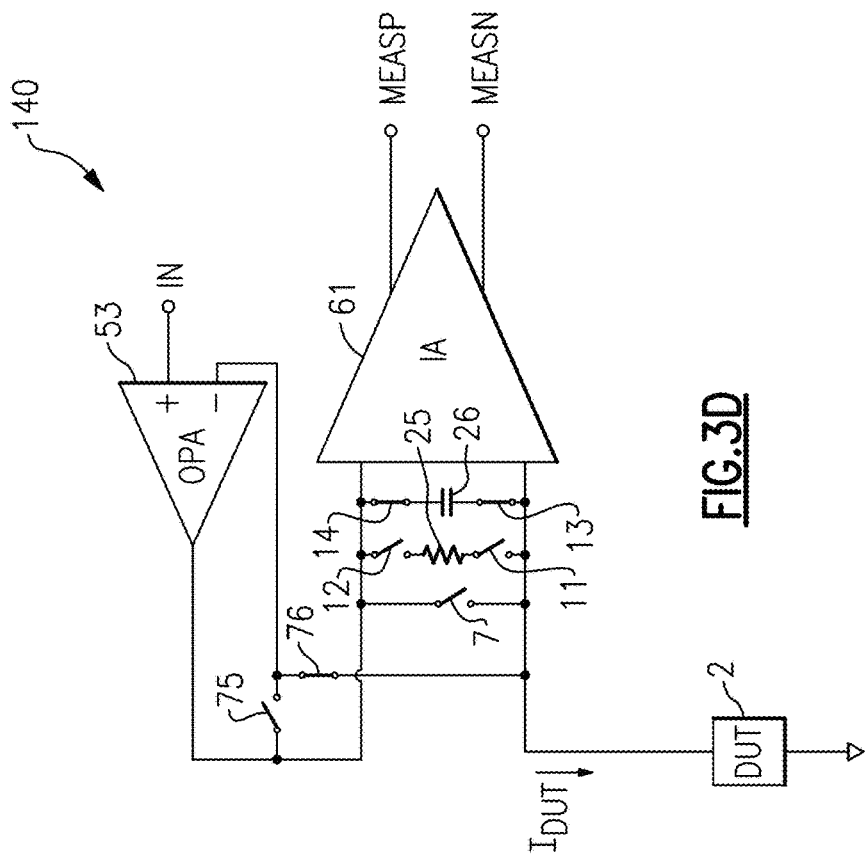
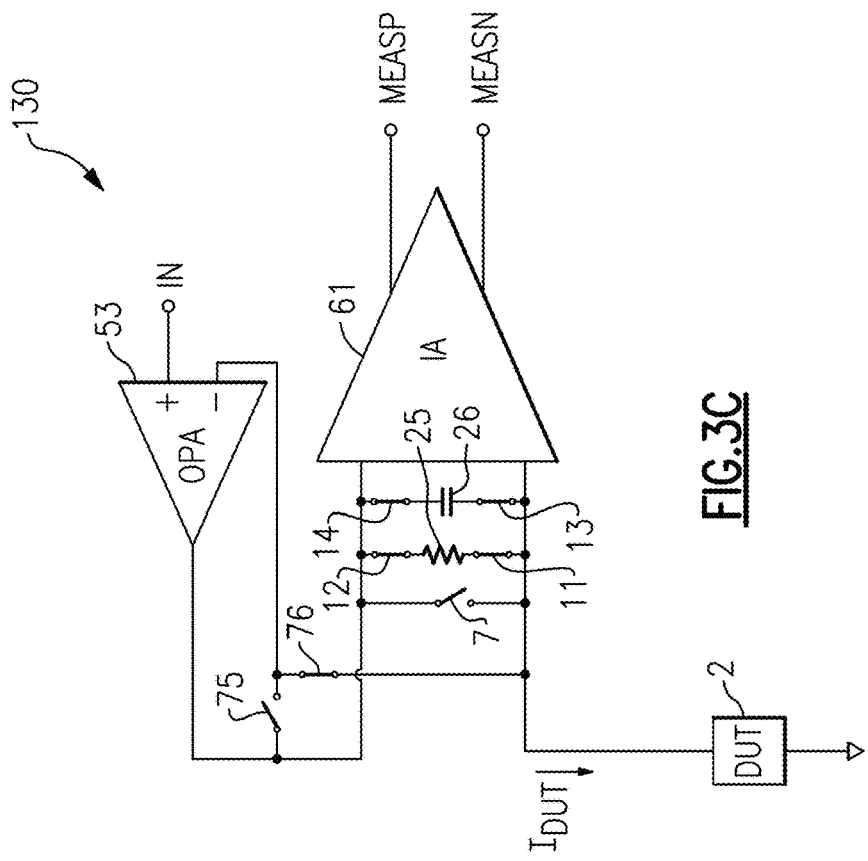

AMPLIFIER SYSTEMS FOR MEASURING A WIDE RANGE OF CURRENT

CROSS-REFERENCE TO RELATED APPLICATIONS

The present application claims priority to U.S. Provisional Patent Application No. 62/746,726, filed Oct. 17, 2018, and titled "AMPLIFIER SYSTEMS FOR MEASURING A WIDE RANGE OF CURRENT," the entirety of which is hereby incorporated herein by reference.

FIELD OF THE DISCLOSURE

Embodiments of the invention relate to electronic systems, and more particularly, to amplifiers.

BACKGROUND

Certain electronic devices employ amplifiers for processing signals. When operating open loop, such amplifiers receive an input signal and generate an output signal having a gain in comparison to the input signal. Examples of amplifiers include, but are not limited to, operational amplifiers, transimpedance amplifiers, and transconductance amplifiers. Certain amplifiers are implemented in a multi-stage configuration to enhance gain and/or performance thereof.

SUMMARY OF THE DISCLOSURE

Amplifier systems for measuring a wide range of current are provided herein. In certain embodiments, an amplifier system includes a controllable sensing circuit, a first amplifier including an output configured to drive a device under test (DUT) through the controllable sensing circuit, and a second amplifier including an input coupled to the controllable sensing circuit and operable to generate a measurement signal indicating an amount of measured current of the DUT. The amplifier system further includes a control circuit operable to control a configuration or mode of the controllable sensing circuit suitable for a particular type of DUT. Implementing the amplifier system in this manner allows measurement of a wide range of current from a variety of DUTs. For instance, the amplifier system can operate as a reconfigurable analog front-end (AFE) suitable for measuring a range of current spanning multiple decades for DUTs having various impedances. For example, the controllable sensing circuit can include resistors, capacitors, and/or other selectable and/or controllable components to thereby provide configurability for different types of loads, such as DUTs of a range of different impedance values.

In one aspect, an amplifier system with controllable current measurement characteristics is provided. The amplifier system includes a load terminal configured to output a current to a DUT, a controllable sensing circuit, a first amplifier including an output electrically connected to the load terminal through the controllable sensing circuit, a second amplifier including an input coupled to the controllable sensing circuit, and a control circuit operable to control an impedance of the controllable sensing circuit. The second amplifier is operable to generate a measurement signal indicating a detected amount of the current outputted from the load terminal.

In another aspect, an electronic module with controllable current measurement characteristics is provided. The electronic module includes a module substrate, and an amplifier die attached to the module substrate. The amplifier die includes a load pin configured to output a current, a first amplifier, a controllable sensing circuit electrically connected between an output of the first amplifier and the load pin, a second amplifier including a first input electrically connected to the output of the first amplifier and a second input electrically connected to the load pin, the second amplifier operable to generate a measurement signal indicating a detected amount of the current outputted from the load pin, and a control circuit operable to control an impedance of the controllable sensing circuit.

In another aspect, a method of controllable current measurement in an amplifier system is provided. The method includes controlling an impedance of a controllable sensing circuit using a control circuit, providing a current from an output terminal to a DUT, driving the output terminal through the controllable sensing circuit using a first amplifier, generating a voltage across the controllable sensing circuit in response to the current, and generating a measurement signal based on amplifying the voltage across the controllable sensing circuit using a second amplifier so as to measure the current.

In another aspect, an amplifier system with controllable current measurement characteristics is provided. The amplifier system includes a first load terminal and a second load terminal, an amplifier including an inverting input electrically connected to the first load terminal and a non-inverting input electrically connected to the second load terminal, a first controllable sensing circuit electrically connected between a non-inverting output of the amplifier and the inverting input of the amplifier, a second controllable sensing circuit electrically connected between an inverting output of the amplifier and the non-inverting input of the amplifier, and a control circuit operable to control an impedance of the first controllable sensing circuit and an impedance of the second controllable sensing circuit.

BRIEF DESCRIPTION OF THE DRAWINGS

FIG. 3A is a schematic diagram illustrating a first example configuration of operation of the amplifier system of FIG. 2.

FIG. 3B is a schematic diagram illustrating a second example configuration of operation of the amplifier system of FIG. 2.

FIG. 3C is a schematic diagram illustrating a third example configuration of operation of the amplifier system of FIG. 2.

FIG. 3D is a schematic diagram illustrating a fourth example configuration of operation of the amplifier system of FIG. 2.

DETAILED DESCRIPTION OF EMBODIMENTS

Figure 1A:
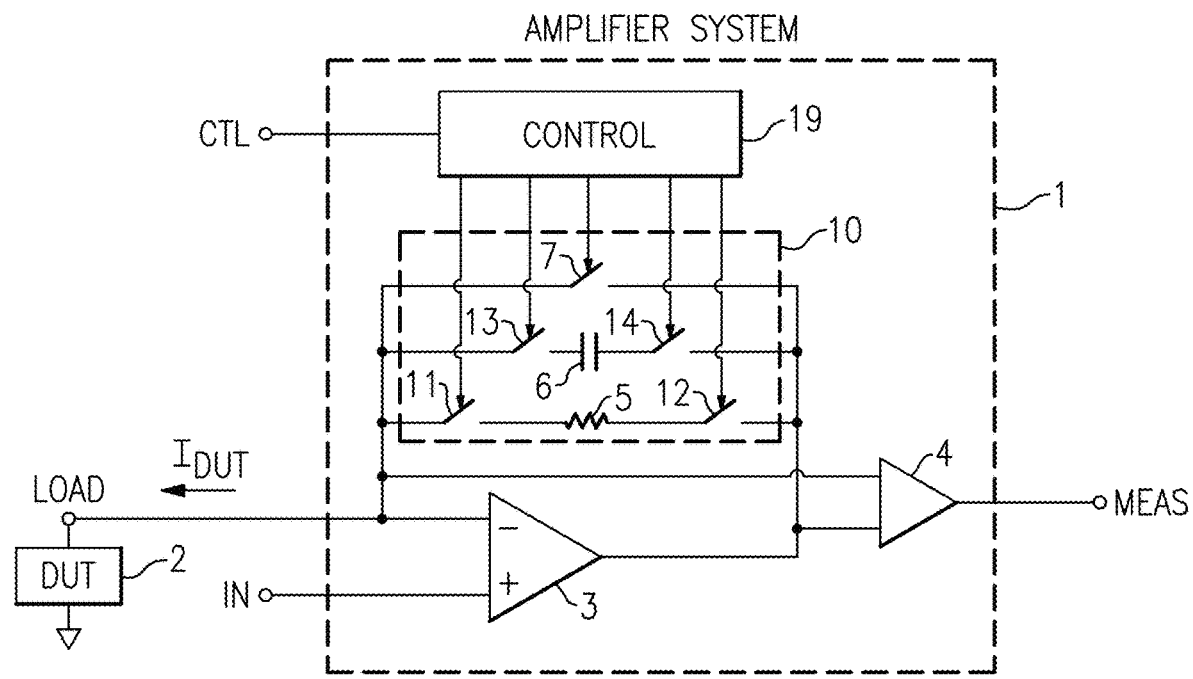
FIG. 1A is a schematic diagram of an amplifier system according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Amplifier systems for measuring a wide range of current are provided herein. In certain embodiments, an amplifier system includes a controllable sensing circuit, a first amplifier including an output configured to drive a device under test (DUT) through the controllable sensing circuit, and a second amplifier including an input coupled to the controllable sensing circuit and operable to generate a measurement signal indicating an amount of current flowing to the DUT. The amplifier system further includes a control circuit operable to control a configuration or mode of the controllable sensing circuit suitable for measuring the current of a particular type of DUT.

Implementing the amplifier system in this manner allows measurement of a wide range of current from a variety of DUTs. For instance, the amplifier system can operate as a reconfigurable analog front-end (AFE) suitable for measuring a range of current spanning multiple decades for DUTs having various impedances. For example, the controllable sensing circuit can include resistors, capacitors, and/or other selectable and/or controllable components to thereby provide configurability for different types of loads, such as DUTs of a range of different impedance values.

In certain implementations, the controllable sensing circuit is connectable between the output of the first amplifier and an inverting input to the first amplifier, thereby controlling an amount of feedback provided to the first amplifier. For instance, an amount of resistive and/or capacitive feedback to the first amplifier can be controlled to achieve desired operating characteristics for a particular DUT and/or application.

Thus, enhanced flexibility of the amplifier system is provided for measuring current from a wide range of possible types of DUTs or loads. Thus, rather than needing a dedicated part (for instance, a particular chip design) for a particular type of DUT, the amplifier systems herein can be incorporated on a semiconductor chip suitable for measuring current from DUTs of a range of different impedances.

In certain implementations, the first amplifier is implemented as an operational amplifier, such as a multi-stage operational amplifier that drives the DUT through the controllable sensing circuit. In certain implementations, the second amplifier is implemented as an instrumentation amplifier, thereby relaxing constraints on input impedance matching and/or providing enhanced measurement accuracy.

The amplifier systems herein operate stably when connected with negative feedback. For example, the controllable sensing circuit can also be configured to provide feedback and/or compensation to maintain stability. In contrast, an amplifier system without such configurability can exhibit oscillation and/or other unstable behavior under certain load conditions.

To further enhance configurability, the amplifier system can be implemented with switches for selectively providing local feedback to the first amplifier.

In certain implementations, the amplifier system is coupled to an interface or bus, such as an inter-Integrated Circuit ($I^2C$) bus, a General Purpose Input Output (GPIO) bus, and/or other suitable interface. Additionally, the amplifier system's control circuit receives digital data from the bus used to control a configuration or setting of the amplifier system. For example, the amplifier system can be fabricated on a semiconductor die or chip, and a user can digitally program a desired configuration or mode of the controllable sensing circuit using the bus. Implementing the amplifier system in this manner provides a convenient and flexible mechanism for user configurability.

The amplifier systems herein can be used in a wide range of applications, including, but not limited to, current measurement of sensors. For example, an amplifier system can be used to measure a sensor's current, thereby detecting various changes in environmental quantities or conditions. In certain implementations, the amplifier system also biases the sensor and/or measures a sensor's bias voltage to aid in enhancing measurement accuracy and/or to protect the sensor from damage from overvoltage or other improper biasing.

In certain implementations, a processing system is included for controlling an input to the first amplifier. For example, the processing system can control a bias voltage of the DUT by setting a signal level to the non-inverting input of the first amplifier. In certain implementations, the processing system processes the measurement signal from the second amplifier and/or other measurement signals to control the input signal level to the first amplifier. Accordingly, the processing system can operate in a feedback loop.

The processing system can be implemented in a wide variety of ways. In one example, the processing system includes an analog-to-digital converter (ADC) for generating digital input data based on the measurement signal, a digital processing circuit for processing the digital input data to generate digital output data, and a digital-to-analog converter (DAC) for controlling the input signal to the first amplifier based on the digital output data.

Implementing the processing system in this manner can provide a number of advantages, including, but not limited to, enhanced flexibility in control of feedback over a range of different configurations of the amplifier system. For example, the digital processing circuit can provide digital integration, digital gain, and/or other desired digital processing to provide a type of feedback desirable for a particular configuration of the amplifier system chosen for a given application and/or type of DUT.

In certain implementations, a processing chip, such as a field-programmable gate array (FPGA) and/or microprocessor, is commonly packaged with an amplifier chip in a multi-chip module. The amplifier chip can include the configurable amplifier system thereon and generate at least one feedback signal based on monitoring signaling conditions of a DUT, such as a sensor external to the multi-chip module. Additionally, the analog feedback signal(s) are processed by the processing chip to generate an input signal for the amplifier chip. Such multi-chip modules are suitable for deployment in a wide range of applications.

FIG. 1A is a schematic diagram of an amplifier system 1 according to one embodiment. The amplifier system 1 includes a first amplifier 3, a second amplifier 4, a controllable sensing circuit 10, and a control circuit 19. Although one embodiment of an amplifier system is shown in FIG. 1A, the teachings herein are applicable to amplifier systems implemented in a wide variety of ways.

With continuing reference to FIG. 1A, the amplifier system 1 includes an input terminal (IN) for receiving an input signal, such as input voltage. The amplifier system 1 further includes a load terminal (LOAD) for coupling to a DUT 2 or other load, and a measurement terminal (MEAS) for outputting a measurement signal indicating an amount of current $I_{DUT}$ to the DUT 2. The amplifier system 1 also includes a control terminal (CTL) for receiving a control signal for selecting a particular configuration or mode of the amplifier system 1. In certain implementations, the control terminal corresponds to a serial interface or bus that receives digital data indicating the desired configuration.

In the illustrated embodiment, the controllable sensing circuit 10 includes a resistor 5, a capacitor 6, an integration reset switch 7, a first resistor selection switch 11, a second resistor selection switch 12, a first capacitor selection switch 13, and a second capacitor selection switch 14. Although one embodiment of a controllable sensing circuit is shown, the teachings herein are applicable to controllable sensing circuits implemented in a wide variety of ways. A controllable sensing circuit, such as the controllable sensing circuit 10 of FIG. 1A, is also referred to herein as a configurable impedance circuit or a configurable current detection circuit.

As shown in FIG. 1A, the control circuit 19 controls a state of the controllable sensing circuit 10. In this embodiment, the control circuit 19 can selectively couple the resistor 5 between the output of the amplifier 3 and the load terminal by opening or closing the first resistor selection switch 11 and the second resistor selection switch 12. Additionally, the control circuit 19 can selectively couple the capacitor 6 between the output of the amplifier 3 and the load terminal by opening or closing the first capacitor selection switch 13 and the second capacitor selection switch 14.

The selection of the resistor 5 and/or the capacitor 6 is chosen based on the control signal received by the control circuit 19. Accordingly, sensing circuitry suitable for a particular type of DUT 2 can be selected. For instance, the current $I_{DUT}$ through the DUT 2 can vary based on a particular type of DUT, for instance, the amount of resistance, capacitance, and/or inductance of the DUT 2.

Although an example in which the resistor 5 is selected using a first pair of switches and the capacitor 6 is selected using a second pair of switches, other selection schemes can be used in accordance with the teachings herein. For instance, in another embodiment, a single switch is used for selection of the resistor 5 and/or a single switch is used for selection of the capacitor 6.

The control circuit 19 also controls the integration reset switch 7 of the controllable sensing circuit 10. The integration reset switch 7 can be used to selectively reset a voltage across the capacitor 6, thereby controlling the capacitor's stored charge. Although one example configuration for resetting the capacitor 6 is shown, other implementations are possible. For instance, in another implementation a first shunt switch is connected to one end of the capacitor 6 and a second shunt switch is connected to a second end of the capacitor 6, and the shunt switches are selectively activated to reset the capacitor 6.

As shown in FIG. 1A, the positive or non-inverting input (+) of the first amplifier 3 is coupled to the input terminal, and the negative or inverting input (−) is coupled to the load terminal. In the illustrated embodiment, the controllable sensing circuit 10 is electrically coupled between the output of the first amplifier 3 and the inverting input of the first amplifier 3, and thus serves to provide controllable feedback to the first amplifier 3. The first amplifier 3 can be implemented in a wide variety of ways, including, but not limited to, using an operational amplifier. In this example, the input terminal to the amplifier system 1 can be controlled to set a bias voltage across the DUT 2.

In the illustrated embodiment, the second amplifier 4 includes a differential input coupled across the controllable sensing circuit 10 and an output that controls the measurement terminal. The second amplifier 4 outputs a measurement signal indicating an amount of current $I_{DUT}$ of the DUT 2. The non-inverting input of the second amplifier 4 can be coupled to the output of the first amplifier 3 and the inverting input of the second amplifier 4 can be coupled to the load terminal, or vice versa. The second amplifier 4 can be implemented in a wide variety of ways, including, but not limited to, using an instrumentation amplifier.

Figure 1B:
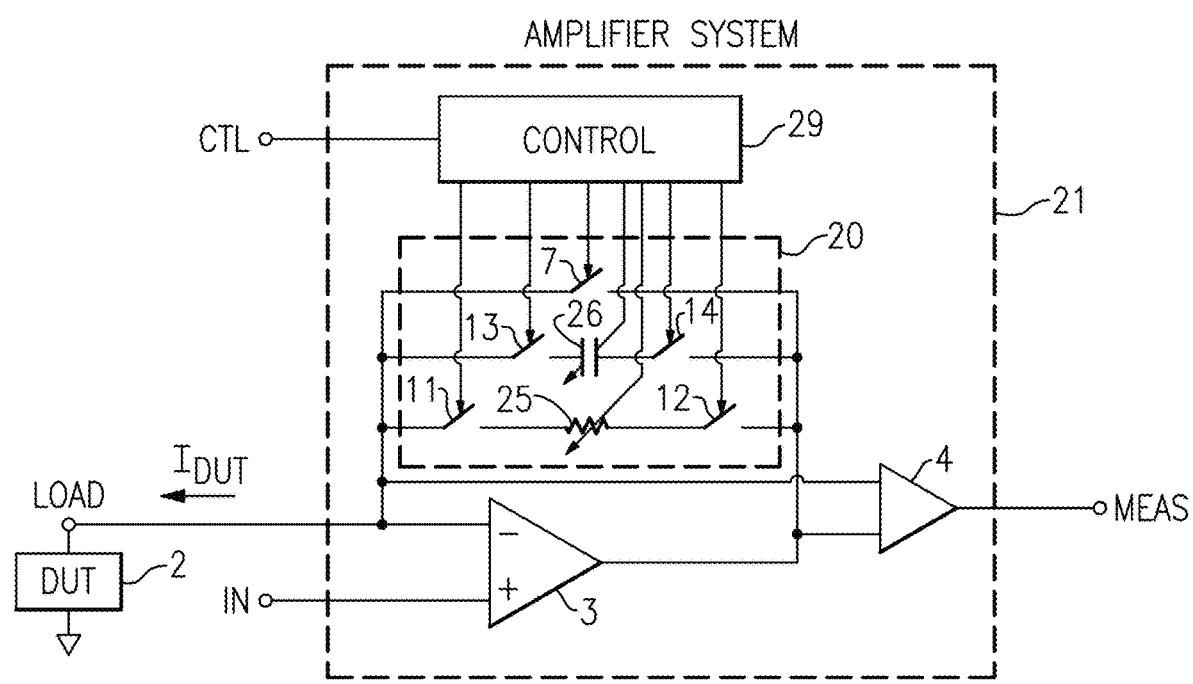
FIG. 1B is a schematic diagram of an amplifier system according to another embodiment.

FIG. 1B is a schematic diagram of an amplifier system 21 according to another embodiment. The amplifier system 21 of FIG. 1B includes a first amplifier 3, a second amplifier 4, a controllable sensing circuit 20, and a control circuit 29. Although another embodiment of an amplifier system is shown in FIG. 1B, the teachings herein are applicable to amplifier systems implemented in a wide variety of ways.

The amplifier system 21 of FIG. 1B is similar to the amplifier system 1 of FIG. 1A, except the amplifier system 21 of FIG. 1B illustrates an implementation in which the controllable sensing circuit 20 includes a controllable resistor 25 and a controllable capacitor 26. As shown in FIG. 1B, the control circuit 29 controls an amount of resistance of the controllable resistor 25 and an amount of capacitance of the controllable capacitor 26.

The controllable resistor 25 and the controllable capacitor 26 can be implemented in a wide variety of ways. In one example, the controllable resistor 25 includes an array of selectable resistive elements (for instance, multiple branches of resistive elements each in series with a corresponding switch) and/or the controllable capacitor 26 includes an array of selectable capacitive elements. In another example, the controllable resistor 25 and/or the controllable capacitor are analog-tuned, for instance, by implementing the resistor and/or capacitor using transistors operating with controllable analog bias to achieve the desired resistance and/or capacitance values. Although various examples of controllable resistors and capacitors have been described, other implementations of controllable elements are possible.

Figure 1C:
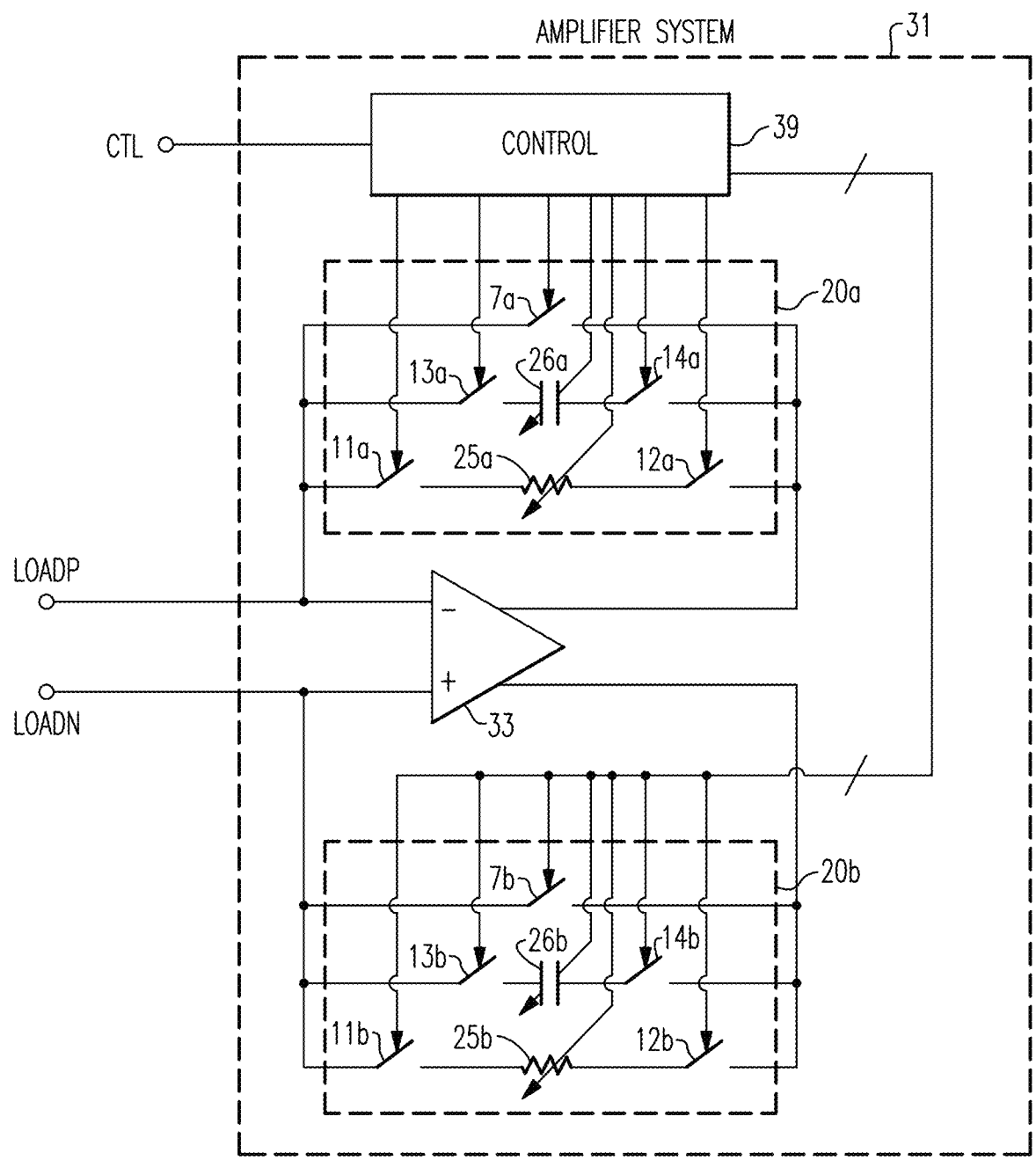
FIG. 1C is a schematic diagram of an amplifier system according to another embodiment.

FIG. 1C is a schematic diagram of an amplifier system 31 according to another embodiment. The amplifier system 31 of FIG. 1C includes a differential input/differential output amplifier 33, a first controllable sensing circuit 20a, a second controllable sensing circuit 20b, and a control circuit 39. Although another embodiment of an amplifier system is shown in FIG. 1C, the teachings herein are applicable to amplifier systems implemented in a wide variety of ways.

The amplifier system 31 of FIG. 1C illustrates one embodiment of an amplifier system in which a pair of controllable sensing circuits are included for differential operation. Although one embodiment of a differential implementation of controllable sensing circuits is shown, any of the embodiments herein can be implemented with differential controllable sensing circuits.

In the illustrated embodiment, the first controllable sensing circuit 20a is electrically coupled between a non-inverting output and an inverting input of the differential input/differential output amplifier 33. Additionally, the second controllable sensing circuit 20b is electrically coupled between an inverting output and a non-inverting input of the differential input/differential output amplifier 33. As shown in FIG. 1C, the inverting input of the differential input/differential output amplifier 33 is coupled to a first load terminal (LOADP), while the non-inverting input of the differential input/differential output amplifier 33 is coupled to a second load terminal (LOADN).

A DUT can be coupled in a wide variety of ways to the first and second load terminals. In certain implementation, a DUT is coupled between the first load terminal and the second load terminal for measurement. However, other configurations are possible, such as implementations in which a first DUT is coupled between the first load terminal and a reference voltage (for instance, ground) and a second DUT is coupled between the second load terminal and the reference voltage.

In the illustrated embodiment, an additional amplifier for generating a measurement signal is omitted in favor of generating a measurement signal using the differential input/differential output amplifier 33. In other embodiments, one or more additional amplifiers are included for generating measurement signals indicating signaling conditions of a DUT.

As shown in FIG. 1C, the first controllable sensing circuit 20a and the second controllable sensing circuit 20b are implemented in accordance with the controllable sensing circuit 20 of FIG. 1B. For example, the first controllable sensing circuit 20a includes a controllable resistor 25a, a controllable capacitor 26a, a integration reset switch 7a, a first resistor selection switch 11a, a second resistor selection switch 12a, a first capacitor selection switch 13a, and a second capacitor selection switch 14a. Additionally, the second controllable sensing circuit 20b includes a controllable resistor 25b, a controllable capacitor 26b, a integration reset switch 7b, a first resistor selection switch 11b, a second resistor selection switch 12b, a first capacitor selection switch 13b, and a second capacitor selection switch 14b.

Although the amplifier system 31 is illustrated with a specific implementation of controllable sensing circuitry, the teachings herein are applicable to amplifier systems using a wide range of controllable sensing circuits. In another embodiment, the controllable resistors 25a-25b and/or controllable capacitors 26a-26b are omitted in favor of using fixed resistor and/or capacitor components.

As shown in FIG. 1C, the control circuit 39 controls the configuration or mode of the first controllable sensing circuit 20a and the second controllable sensing circuit 20b based on a control signal received from the control terminal (CTL). Accordingly, sensing circuitry suitable for a particular type of DUT can be selected.

Figure 2:
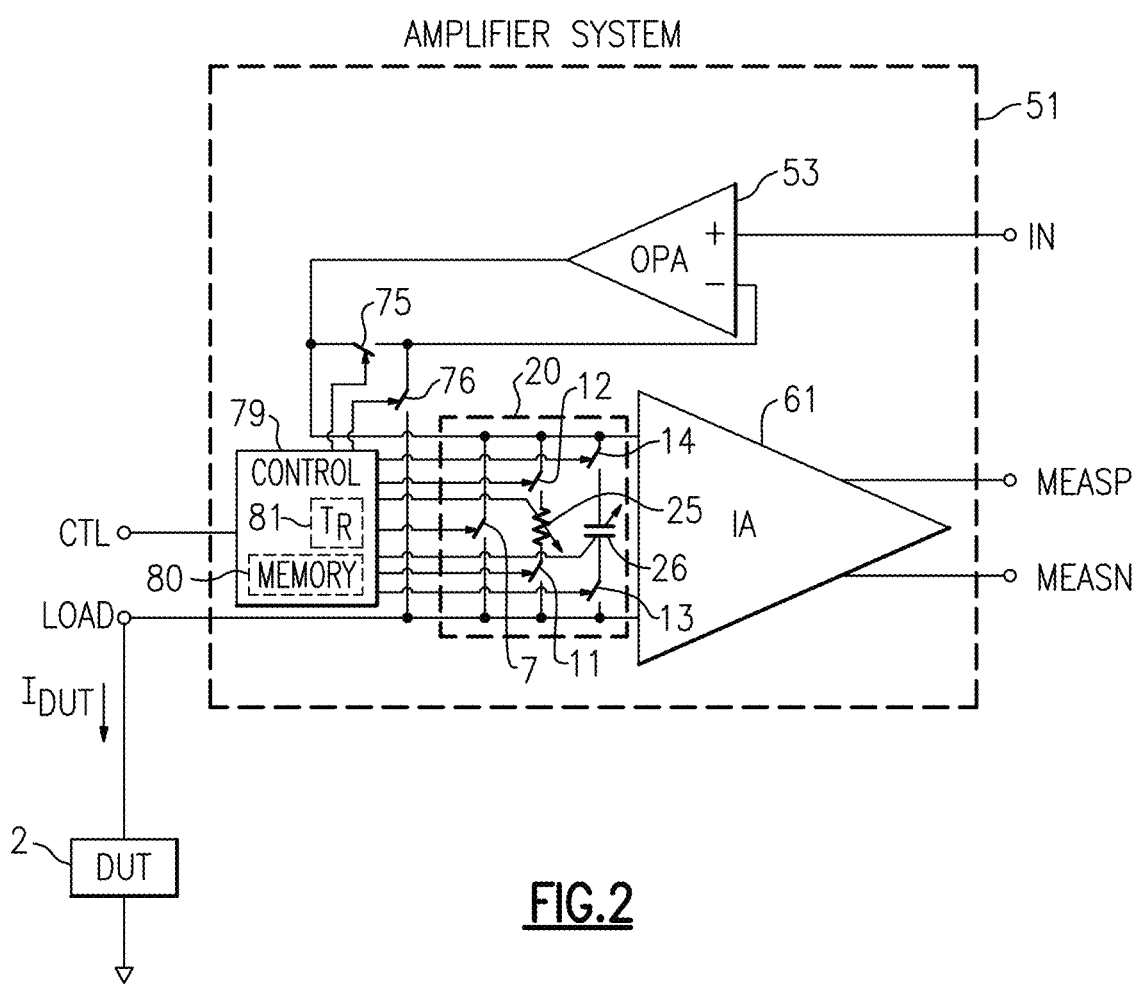
FIG. 2 is a schematic diagram of an amplifier system according to another embodiment.

FIG. 2 is a schematic diagram of an amplifier system 51 according to another embodiment. The amplifier system 51 includes a controllable sensing circuit 20, an operational amplifier 53, an instrumentation amplifier 61, a first feedback switch 75, a second feedback switch 76, and a control circuit 79.

The amplifier system 51 of FIG. 2 is similar to the amplifier system 21 of FIG. 1B, except that the amplifier system 51 further includes the first feedback switch 75 and the second feedback switch 76, and is implemented with specific implementations of amplifiers and control circuitry.

For example, in this embodiment, the amplifier system 51 includes the operational amplifier 53 for driving the DUT 2 based on the input signal received from the input terminal (IN). Including the operational amplifier 53 provides a number of advantages, such as high gain, low DC error, and/or stability over a range of operating scenarios. Additionally, the amplifier system 51 includes the instrumentation amplifier 61 for generating a differential measurement signal between a non-inverted measurement terminal (MEASP) and an inverted measurement terminal (MEASN). Including the instrumentation amplifier 61 provides a number of advantages, including, but not limited to, relaxed constraints on input impedance matching and/or enhanced measurement accuracy. Although an example with a differential measurement signal is shown, other implementations are possible.

With continuing reference to FIG. 2, including the first feedback switch 75 and/or the second feedback switch 76 enhances the flexibility of the amplifier system 51 relative to the amplifier system 21 of FIG. 1B. For example, including the first feedback switch 75 allows the control circuit 79 to selectively provide local feedback between the output and inverting input of the operational amplifier 53. In certain implementations, the amplifier system 51 further includes a feedback impedance (for instance, a controllable resistor and/or a controllable capacitor) in series with the first feedback switch 75.

The second feedback switch 76 is coupled between the load terminal (LOAD) and the inverting input of the operational amplifier 53. Thus, the second feedback switch 51 can be activated to provide feedback from the load terminal rather than directly from the output of the operational amplifier 53. Such feedback can be used to provide accurate control of a voltage of the load terminal based on a voltage of the input terminal. In certain implementations, the amplifier system 51 further includes a feedback impedance (for instance, a controllable resistor and/or a controllable capacitor) in series with the second feedback switch 76.

In the illustrated embodiment, the control circuit 79 includes a memory circuit 80 and a reset switching control circuit 81. The memory circuit 80 includes digital data indicating a particular configuration of the amplifier system 51. Additionally, the memory circuit 80 receives digital data from the control terminal CTL, which in certain implementations corresponds to a chip interface or bus.

In certain implementations, the memory circuit 80 includes a volatile memory that is programmed with the desired configuration of the amplifier system 51 using the control signal after power-up. For instance, a user of the amplifier system 51 can program the memory circuit 80 with data indicating the desired configuration of the amplifier system 51. However, other configurations are possible, such as implementations in which the memory circuit 80 includes a non-volatile memory (for instance, a flash memory, a read-only memory (ROM), fuses, anti-fuses, and/or a magnetic storage device) programmed with the configuration data. In such implementations, the memory circuit 80 can be programmed after manufacture with data associated with a particular target application or DUT.

The reset switching control circuit 81 controls switching operations of the integration reset switch 7, thereby controlling when the voltage across the programmable capacitor 26 is reset. For example, in certain implementations, the reset switching control circuit 81 periodically closes the integration reset switch 7 with a desired period of reset switching ($T_R$). In certain implementations, the timing of the integration reset switch 7 (for instance, the period of reset switching) is selected using digital data received from the control terminal (CTL) and/or stored in the memory circuit 80.

FIGS. 3A-3D illustrate various example configurations or modes of operation of the amplifier system 51 of FIG. 2. For clarity of the figures, the control circuit 79 of FIG. 2 and associated control signaling is not depicted. Although four example configurations of operation are shown, the amplifier system 51 can be configured in a wide variety of ways and/or operate with a wide variety of types of DUTs. Accordingly, other implementations are possible.

FIG. 3A is a schematic diagram illustrating a first example configuration 110 of operation of the amplifier system 51 of FIG. 2.

In this example, the first resistor selection switch 11, the second resistor selection switch 12, and the first feedback switch 75 are closed, while the integration reset switch 7, the first capacitor selection switch 13, the second capacitor selection switch 14, and the second feedback switch 76 are opened. Additionally, the resistance of the controllable resistor 25 is controlled to a desired value using the control circuit 79 of FIG. 2.

With continuing reference to FIG. 3A, the operational amplifier 53 is configured as a unity-gain buffer or follower, in this example. Additionally, the current $I_{DUT}$ of the DUT 2 is converted to a voltage through the resistor 25. The instrumentation amplifier 61 amplifies the voltage differential across the resistor 25 to generate a differential measurement signal indicating an amount of measured current of the DUT 2.

FIG. 3B is a schematic diagram illustrating a second example configuration 120 of operation of the amplifier system 51 of FIG. 2.

In this example, the first resistor selection switch 11, the second resistor selection switch 12, and the second feedback switch 76 are closed, while the integration reset switch 7, the first capacitor selection switch 13, the second capacitor selection switch 14, and the first feedback switch 75 are opened. Additionally, the resistance of the controllable resistor 25 is controlled to a desired value using the control circuit 79 of FIG. 2.

With continuing reference to FIG. 3B, the operational amplifier 53 is configured as a resistive transimpedance amplifier. Additionally, since the second feedback switch 76 is closed, the operational amplifier 53 biases the DUT 2 with a bias voltage corresponding to an input voltage of the input terminal (IN). Furthermore, the current $I_{DUT}$ of the DUT 2 is converted to a voltage through the resistor 25 with a gain based on the resistor's selected resistance. The instrumentation amplifier 61 amplifies the voltage differential across the resistor 25 to generate a differential measurement signal indicating an amount of measured current of the DUT 2.

Configuring an amplifier system to operate as a resistive transimpedance amplifier can be desirable for a wide variety of applications, such as when measuring a large amount of current. In contrast, when measuring a large current using a capacitive transimpedance amplifier, a large value capacitor and/or a high clock rate of a reset integration switch may be needed to avoid saturating the capacitor.

FIG. 3C is a schematic diagram illustrating a third example configuration 130 of operation of the amplifier system 51 of FIG. 2.

In this example, the first resistor selection switch 11, the second resistor selection switch 12, the first capacitor selection switch 13, the second capacitor selection switch 14, and the second feedback switch 76 are closed, while the integration reset switch 7 and the first feedback switch 75 are opened. Additionally, the resistance of the controllable resistor 25 and the capacitance of the controllable capacitor 26 are controlled to desired values using the control circuit 79 of FIG. 2.

With continuing reference to FIG. 3C, the operational amplifier 53 is configured as a resistive transimpedance amplifier. Additionally, the current $I_{DUT}$ of the DUT 2 is converted to a voltage through the resistor 25 with a gain based on the resistor's selected resistance. Furthermore, the instrumentation amplifier 61 amplifies the voltage differential across the resistor 25 to generate a differential measurement signal indicating an amount of measured current of the DUT 2. The capacitor 26 is also selected in this configuration, and serves to provide frequency compensation or stability to the transimpedance amplifier 61 and/or to limit a bandwidth of the transimpedance amplifier 61.

FIG. 3D is a schematic diagram illustrating a fourth example configuration 140 of operation of the amplifier system 51 of FIG. 2.

In this example, the first capacitor selection switch 13, the second capacitor selection switch 14, and the second feedback switch 76 are closed, while the first resistor selection switch 11, the second resistor selection switch 12, and the first feedback switch 75 are opened. Additionally, the capacitance of the controllable capacitor 26 is controlled to a desired value using the control circuit 79 of FIG. 2. The integration reset switch 7 is depicted as opened, but is selectively closed (for instance, with a desired period of reset switching) by the control circuit 79 of FIG. 2. In certain implementations, the timing of the integration reset switch 7 (for instance, the period of reset switching) is selected using digital data received from the control terminal (CTL) of FIG. 2.

With continuing reference to FIG. 3D, the operational amplifier 53 is configured as a capacitive transimpedance amplifier. Additionally, the current $I_{DUT}$ of the DUT 2 is integrated onto the capacitor 26, with the integration reset switch 7 selectively closed as desired (for instance, periodically based on a period of reset switching) to reset the charge on the capacitor 26. Furthermore, the instrumentation amplifier 61 amplifies the voltage across the across the capacitor 26 to generate a differential measurement signal indicating an amount of measured current of the DUT 2.

Configuring an amplifier system to operate as a capacitive transimpedance amplifier can be desirable for a wide variety of applications, such as when measuring a small amount of current to avoid a need for using a large value resistor.

Figure 4:
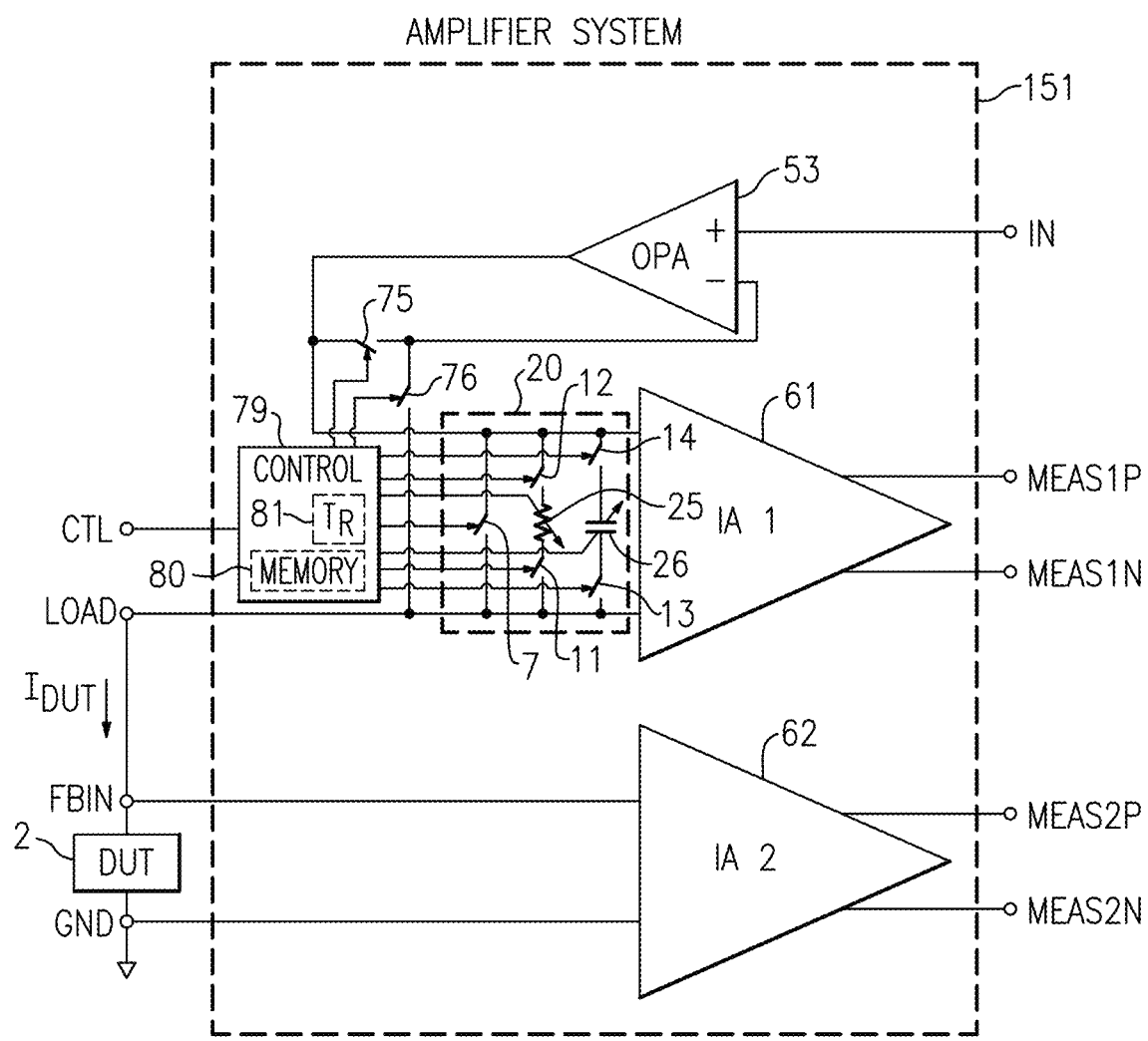
FIG. 4 is a schematic diagram of an amplifier system according to another embodiment.

FIG. 4 is a schematic diagram of an amplifier system 151 according to another embodiment. The amplifier system 151 of FIG. 4 is similar to the amplifier system 51 of FIG. 2, except that the amplifier system 151 further includes a second instrumentation amplifier 62. For example, the amplifier system 151 not only includes the first instrumentation amplifier 61 for generating a first differential measurement signal between a first non-inverted measurement terminal (MEAS1P) and a first inverted measurement terminal (MEAS1N), but also the second instrumentation amplifier 62 for generating a second differential measurement signal between a second non-inverted measurement terminal (MEAS2P) and a second inverted measurement terminal (MEAS2N).

As discussed above, the first differential measurement signal from the first instrumentation amplifier 61 indicates an amount of current $I_{DUT}$ of the DUT 2 as measured by the amplifier system 151. As shown in FIG. 4, the second instrumentation amplifier 62 amplifies a voltage across the DUT 2 to generate the second differential measurement signal, and thus the second differential measurement signal indicates a bias voltage of the DUT 2.

By including the second instrumentation amplifier 62, a voltage across the DUT 2 is measured. Thus, the second differential measurement signal can be processed to monitor the DUT's bias voltage. In certain implementations, the second instrumentation amplifier 62 is connected to the input terminal (IN) through a feedback loop that enhances an accuracy of biasing and/or protects the DUT 2 from over-voltage and/or other undesired biasing conditions.

In the embodiment of FIG. 4, the second instrumentation amplifier 62 includes a first input coupled to a feedback input terminal (FBIN) and a second input coupled to a ground terminal (GND), which in turn are coupled to a first terminal and a second terminal, respectively, of the DUT 2. By including the feedback input terminal, enhanced flexibility in controlling feedback to the second instrumentation amplifier 62 is provided. For example, different configurations of feedback can be used suitable for a particular application.

Although an embodiment with specific types of amplifiers and controllable sensing circuitry is shown, the teachings herein are applicable to amplifier systems using a wide variety of types of amplifiers and/or controllable sensing circuits. Furthermore, although certain signals are indicated as single-ended or differential, the amplifier systems herein can use a wide variety of types of signaling.

Figures 5A, 5B:
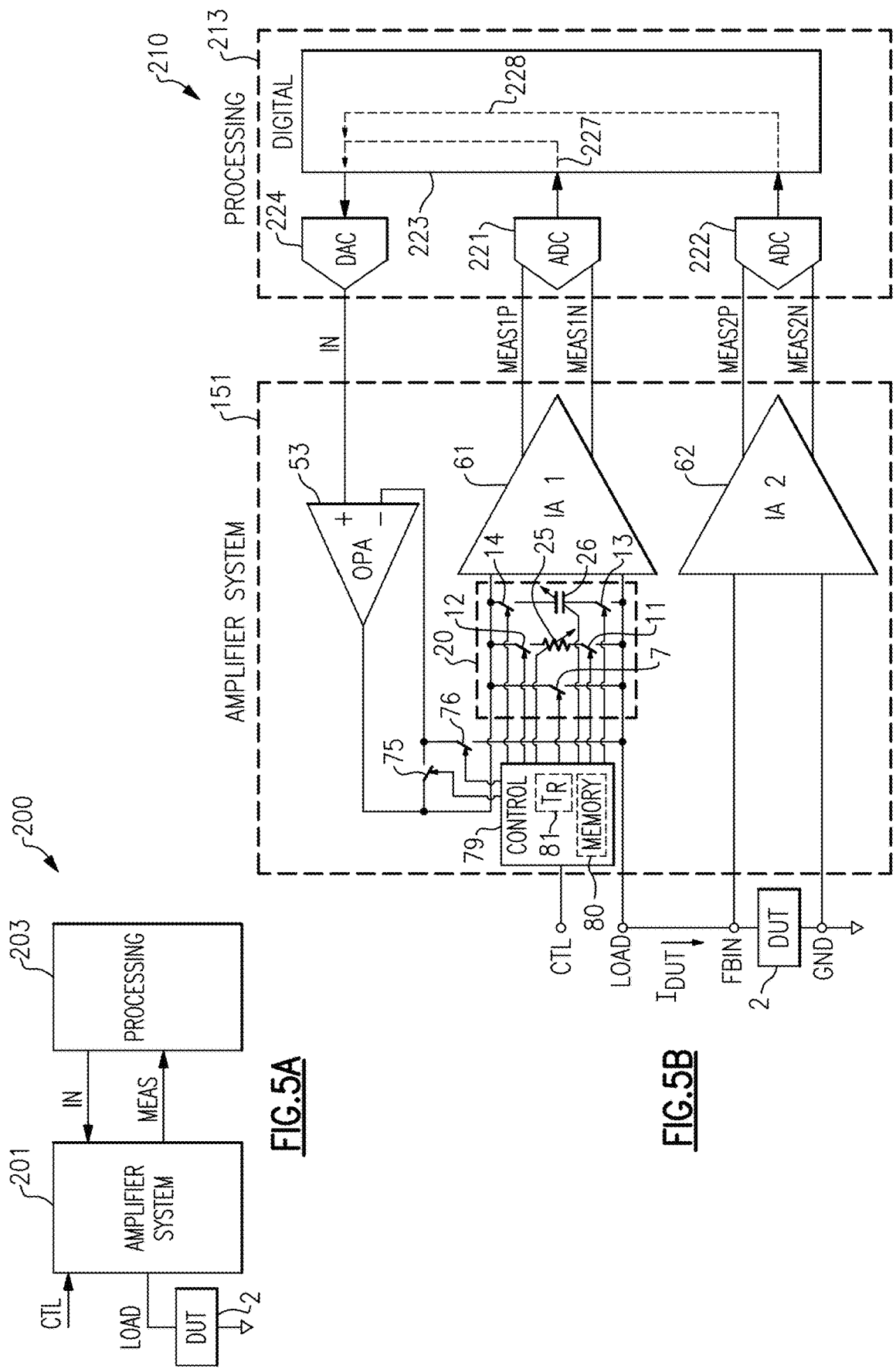
FIG. 5A is a schematic diagram of one embodiment of an electronic system including an amplifier system controlled by processing.
FIG. 5B is a schematic diagram of another embodiment of an electronic system including an amplifier system controlled by processing.

FIG. 5A is a schematic diagram of one embodiment of an electronic system 200 including an amplifier system controlled by processing. The electronic system 200 includes an amplifier system 201, a DUT 2, and a processing system 203.

As shown in FIG. 5A, the amplifier system 201 includes an input terminal (IN) that receives an input signal from the processing system 203. Additionally, the amplifier system 201 includes a load terminal (LOAD) for coupling to the DUT 2, and a control terminal (CTL) for receiving a control signal for configuring the amplifier system 201. The amplifier system 201 can be implemented in accordance with any of the embodiments herein.

In the illustrated embodiment, the processing system 203 receives one or more measurement signals indicating a signaling condition of the DUT 2. Additionally, the processing system 203 processes the measurement signal(s) using desired processing operations. In certain implementations, the processing system 203 controls the input signal to the amplifier system 201 based on the measurement signal(s). Thus, the processing system 203 can be used to control feedback.

Although FIG. 5A illustrates one embodiment of an amplifier system with processing, the teachings herein are applicable to amplifier systems implemented in a wide variety of ways.

FIG. 5B is a schematic diagram of another embodiment of an electronic system 210 including an amplifier system controlled by processing. The electronic system 210 of FIG. 5B is similar to the electronic system 200 of FIG. 5A, except that the electronic system 210 includes a specific implementation of an amplifier system and of a processing system.

For example, the electronic system 210 of FIG. 5B has been implemented with the amplifier system 151 described above with respect to FIG. 4. Additionally, the electronic system 210 includes a processing system 213 that includes a first ADC 221, a second ADC 222, a digital processing circuit 223, and a DAC 224.

As shown in FIG. 5B, the first ADC 221 digitizes the first measurement signal from the first instrumentation amplifier 61 to generate a first digital measurement signal for the digital processing circuit 223. Additionally, the second ADC 222 digitizes the second measurement signal from the second instrumentation amplifier 62 to generate a second digital measurement signal for the digital processing circuit 223.

With continuing reference to FIG. 5B, the digital processing circuit 223 generates digital output data, which the DAC 224 processes to control the input signal to the amplifier system 151.

In certain implementations, the digital output data is generated based on processing the first digital measurement signal and/or the second digital measurement signal. For example, first digital feedback 227 can be provided based on the first digital measurement signal and/or second digital feedback 228 can be provided based on the second digital measurement signal.

Using the processing system 213 to provide feedback enhances flexibility in control of feedback over a range of different configurations of the amplifier system 151 and/or different types of the DUT 2. For example, the digital processing circuit 223 can provide digital integration, digital gain, and/or other desired digital processing to provide a type and/or an amount of feedback desirable for a particular configuration of the amplifier system 151 selected for a particular usage scenario.

The digital processing circuit 223 can be implemented in a wide variety of ways. In certain implementations, the digital processing circuit 223 includes at least one of an FPGA and/or microprocessor for providing a wide variety of types of digital processing.

Figure 6:
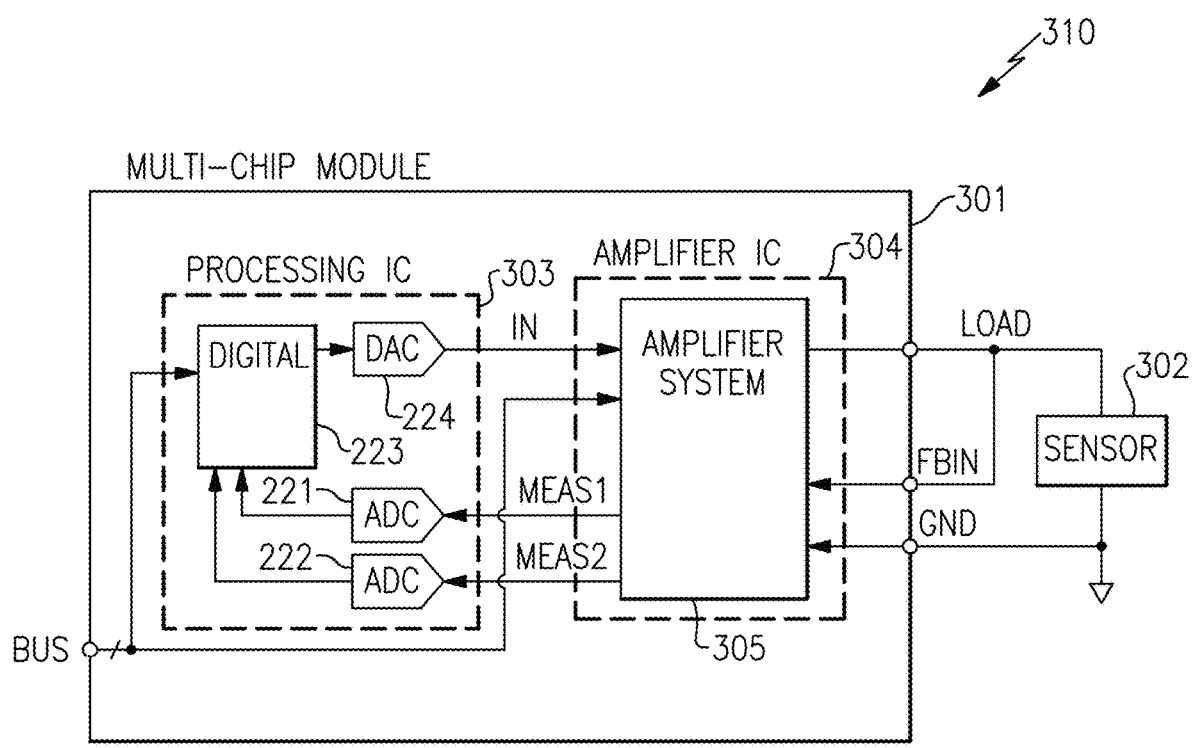
FIG. 6 is a schematic diagram of a multi-chip module according to one embodiment.

FIG. 6 is a schematic diagram of a multi-chip module 310 according to one embodiment. The multi-chip module 310 includes a processing chip 303 and an amplifier chip 304 connected to a module substrate 301. A chip is also referred to herein as a semiconductor die or integrated circuit (IC). Although depicted schematically, the multi-chip module 310 can also include adhesives, solder, encapsulation, surface mount components, additional pins or pads, and/or a wide variety of other structures that have been omitted for clarity of the figures.

The multi-chip module 310 illustrates one example of an electronic module implemented in accordance with the teachings herein. In the illustrated embodiment, the processing chip 303 includes the first ADC 221, the second ADC 222, the digital processing circuit 223, and the DAC 224 fabricated thereon. Additionally, the amplifier chip 304 includes the amplifier system 305 fabricated thereon. The amplifier system 305 can be implemented in accordance with any of the embodiments herein.

The amplifier chip 304 includes an input pin for receiving an input signal from the processing chip 303, and a load pin for coupling to the sensor 302 through a load pin of the multi-chip module 310. The amplifier chip 304 also includes a feedback input pin and a ground pin for receiving a differential feedback signal through corresponding pins of the module. In this example, the differential feedback signal corresponds to a voltage across the sensor 302.

In the illustrated embodiment, the multi-chip module 310 includes an interface or bus (BUS) that is coupled through pins of the dies to the digital processing circuit 223 and amplifier system 305. The bus can be used to program digital data to the processing chip 303 and amplifier chip 304 to achieve a desired configuration of the multi-chip module 310 for a given sensor 302. In certain implementations, the processing IC 303 corresponds to an FPGA and/or microprocessor operable to receive digital data from the bus to control the type of processing computations performed. Such computations can include, but are not limited to, digital control of feedback.

As shown in FIG. 6, the load pin (LOAD) of the multi-chip module 310 couples to a first terminal of the sensor 302. In this example, the feedback input pin (FBIN) of the multi-chip module 310 also couples to the first terminal of the sensor 302. However, other implementations are possible, such as implementations using different configurations of feedback. Including an output pin and a separate feedback input pin enhances the flexibility of the multi-chip module 310. In this example, the multi-chip module 310 also includes a ground pin (GND) coupled to a second terminal of the sensor 302. Thus, a voltage across the sensor 302 is provided to the amplifier system 304 to thereby monitor signaling conditions of the sensor 302.

The multi-chip module 310 of FIG. 6 is suitable for deployment in a wide range of applications. For example, the multi-chip module 310 can operate in combination with a wide variety of types of sensors, including sensors with varying impedances and/or biasing conditions. Although one example of a multi-chip module is shown, the teachings herein are applicable to a wide variety of types of electronic systems and modules. Accordingly, other implementations are possible.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. An amplifier system with controllable current measurement characteristics, the amplifier system comprising:
    a load terminal configured to output a current to a device under test (DUT);
    a control circuit;
    a controllable sensing circuit, wherein the controllable sensing circuit includes a resistor and a capacitor each selectable by the control circuit to control an impedance of the controllable sensing circuit;
    a first amplifier including an output electrically connected to the load terminal through the controllable sensing circuit;
    a second amplifier including an input coupled to the controllable sensing circuit, wherein the second amplifier is operable to generate a measurement signal indicating a detected amount of the current outputted from the load terminal, wherein the second amplifier is further operable to amplify a signal provided by the capacitor when the capacitor is selected by the control circuit.

2. The amplifier system of claim 1, wherein the first amplifier is an operational amplifier and the second amplifier is an instrumentation amplifier.

3. The amplifier system of claim 1, wherein the input of the second amplifier is differentially connected across the controllable sensing circuit.

4. The amplifier system of claim 1, wherein the control circuit is operable in a first mode in which the resistor is selected and the capacitor is not selected, a second mode in which the capacitor is selected and the resistor is not selected, and a third mode in which both the resistor and the capacitor are selected.

5. The amplifier system of claim 1, wherein the control circuit further comprises a reset integration switch selectively activated by the control circuit to control an amount of charge stored on the capacitor.

6. The amplifier system of claim 1, wherein at least one of an amount of resistance of the resistor or an amount of capacitance of the capacitor is controllable by the control circuit.

7. The amplifier system of claim 1, further comprising a feedback switch coupled between an inverting input of the first amplifier and the output of the first amplifier and controlled by the control circuit.

8. The amplifier system of claim 1, further comprising a feedback switch coupled between an inverting input of the first amplifier and the load terminal.

9. The amplifier system of claim 1, wherein the control circuit is further configured to receive digital data over an interface, and to control the controllable sensing circuit based on the digital data.

10. The amplifier system of claim 1, further comprising a third amplifier including an input electrically coupled to the load terminal, the third amplifier configured to generate a bias measurement signal indicating a voltage of the load terminal.

11. The amplifier system of claim 1, wherein the signal corresponds to a voltage across the capacitor.

12. An electronic module with controllable current measurement characteristics, the electronic module comprising:
    a module substrate; and
    an amplifier die attached to the module substrate, the amplifier die comprising:
        a load pin configured to output a current;
        a first amplifier;
        a control circuit;
        a controllable sensing circuit electrically connected between an output of the first amplifier and the load pin, wherein the controllable sensing circuit includes a resistor and a capacitor each selectable by the control circuit to control an impedance of the controllable sensing circuit;

a second amplifier including a first input electrically connected to the output of the first amplifier and a second input electrically connected to the load pin, the second amplifier operable to generate a measurement signal indicating a detected amount of the current outputted from the load pin, wherein the second amplifier is further operable to amplify a signal provided by the capacitor when the capacitor is selected by the control circuit.

13. The electronic module of claim 12, wherein the control circuit further comprises a reset integration switch selectively activated by the control circuit to control an amount of charge of the capacitor.

14. The electronic module of claim 12, further comprising a processing die attached to the module substrate and configured to control an input signal to a non-inverting input of the first amplifier.

15. The electronic module of claim 14, wherein the processing die includes a first ADC configured to generate a first digital input signal based on the measurement signal, a digital processing circuit configured to process the first digital input signal to generate digital output data, and a DAC configured to generate the input signal based on the digital output data.

16. The electronic module of claim 15, wherein the amplifier die further comprises a third amplifier including an input coupled to the load pin and an output configured to generate a bias measurement signal indicating a voltage of the load pin, the processing die further comprising a second ADC configured to generate a second digital input signal based on the bias measurement signal, wherein the digital processing circuit is further configured to generate the digital output data based on the second digital input signal.

17. The electronic module of claim 12, wherein the signal corresponds to a voltage across the capacitor.

18. A method of controllable current measurement in an amplifier system, the method comprising:
controlling an impedance of a controllable sensing circuit using a control circuit, the controllable sensing circuit including a resistor and a capacitor each selectable by the control circuit;
providing a current from an output terminal to a device under test (DUT);
driving the output terminal through the controllable sensing circuit using a first amplifier;
generating a voltage across the controllable sensing circuit in response to the current;
generating a measurement signal based on amplifying the voltage across the controllable sensing circuit using a second amplifier so as to measure the current; and
amplifying a signal provided by the capacitor using the second amplifier when the capacitor is selected by the control circuit.

19. The method of claim 18, further comprising receiving digital data as an input to the control circuit over an interface.

20. The method of claim 18, wherein controlling the impedance of the controllable sensing circuit comprises controlling an amount of resistance of the resistor and an amount of capacitance of the capacitor sensing circuit.

* * * * *

UNITED STATES PATENT AND TRADEMARK OFFICE
CERTIFICATE OF CORRECTION

| | |
|---|---|
| PATENT NO. | : 10,972,063 B2 |
| APPLICATION NO. | : 16/174830 |
| DATED | : April 6, 2021 |
| INVENTOR(S) | : Basilico et al. |

Page 1 of 1

It is certified that error appears in the above-identified patent and that said Letters Patent is hereby corrected as shown below:

In the Claims

In Column 16, Line 31, Claim 20, delete "capacitor sensing circuit." and insert -- capacitor. --.

Signed and Sealed this
Eighth Day of June, 2021

Drew Hirshfeld
*Performing the Functions and Duties of the
Under Secretary of Commerce for Intellectual Property and
Director of the United States Patent and Trademark Office*